(12) United States Patent
Kurokawa

(10) Patent No.: US 9,356,107 B2
(45) Date of Patent: May 31, 2016

(54) SEMICONDUCTOR DEVICE AND PRODUCTION DEVICE THEREFOR

(71) Applicant: Yuto Kurokawa, Toyota (JP)

(72) Inventor: Yuto Kurokawa, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/430,655

(22) PCT Filed: Oct. 15, 2012

(86) PCT No.: PCT/JP2012/076599
§ 371 (c)(1),
(2) Date: Mar. 24, 2015

(87) PCT Pub. No.: WO2014/061075
PCT Pub. Date: Apr. 24, 2014

(65) Prior Publication Data
US 2015/0243749 A1    Aug. 27, 2015

(51) Int. Cl.
| | | |
|---|---|---|
| *H01L 29/76* | (2006.01) |
| *H01L 29/94* | (2006.01) |
| *H01L 29/423* | (2006.01) |
| *H01L 21/3065* | (2006.01) |
| *H01J 37/32* | (2006.01) |
| *H01L 29/66* | (2006.01) |
| *H01L 29/739* | (2006.01) |
| *H01L 29/78* | (2006.01) |
| *H01L 21/67* | (2006.01) |
| *H01L 29/06* | (2006.01) |
| *H01L 29/10* | (2006.01) |

(52) U.S. Cl.
CPC ....... *H01L 29/4236* (2013.01); *H01J 37/32669* (2013.01); *H01L 21/3065* (2013.01); *H01L 21/67069* (2013.01); *H01L 29/0696* (2013.01); *H01L 29/1095* (2013.01); *H01L 29/42376* (2013.01); *H01L 29/66348* (2013.01); *H01L 29/66734* (2013.01); *H01L 29/7397* (2013.01); *H01L 29/7813* (2013.01)

(58) Field of Classification Search
CPC .......................... H01L 29/7813; H01L 29/4236
USPC .......................................................... 257/334
See application file for complete search history.

(56) References Cited

U.S. PATENT DOCUMENTS

| 6,514,377 B1 | 2/2003 | Morimoto |
| 2006/0267085 A1 | 11/2006 | Matsuura |
| 2008/0054351 A1 | 3/2008 | Ooki |
| 2008/0265427 A1 | 10/2008 | Hirler et al. |
| 2010/0267209 A1* | 10/2010 | Ooki .............................. 438/138 |

FOREIGN PATENT DOCUMENTS

| JP | 2004-273849 A | 9/2004 |
| JP | 2006-324488 A | 11/2006 |
| JP | 2008-060138 A | 3/2008 |

* cited by examiner

*Primary Examiner* — Theresa T Doan
(74) *Attorney, Agent, or Firm* — Oliff PLC

(57) ABSTRACT

A semiconductor device includes a plurality of trench gates extending in a first direction and arranged with a space between one another in a second direction which is orthogonal to the first direction. Each of the plurality of trench gates includes: a first portion opened on a front surface of the semiconductor substrate; a second portion extending from the first portion in a direction inclined relative to a depth direction of the semiconductor substrate toward a positive direction of the second direction; and a third portion extending from the first portion in a direction inclined relative to the depth direction of the semiconductor substrate toward a negative direction of the second direction.

6 Claims, 9 Drawing Sheets

SEMICONDUCTOR DEVICE AND PRODUCTION DEVICE THEREFOR

TECHNICAL FIELD

The present invention relates to a semiconductor device and a production device therefor.

BACKGROUND ART

In a trench gate-type semiconductor device, an on voltage in the semiconductor device can be reduced by arranging a plurality of trench gates so that a space between the adjacent trench gates becomes narrow. However, a semiconductor substrate is in contact with a surface electrode in a region between the trench gates, and when the space between the adjacent trench gates is narrow, a contact area between the semiconductor substrate and the surface electrode becomes small. Accordingly, a problem of increasing a contact resistance between the semiconductor substrate and the surface electrode and the like occur. Therefore, in Japanese Patent Application Publication No. 2006-324488 (Patent Literature 1), a space between bottom parts of the adjacent trench gates is narrow by widening only the bottom parts of the trench gates.

CITATION LIST

Patent Literature

[Patent Literature 1] Japanese Patent Application Publication No. 2006-324488

SUMMARY OF INVENTION

Technical Problem

As described in Japanese Patent Application Publication No. 2006-324488 when only the bottom parts of the trench gates are widened, the following problems occur. Firstly, the number of steps of forming trenches each having a shape in which only a bottom part is wide is increased, so that the steps are complicated. Secondly, when a gate electrode is filled in each trench, a void in the gate electrode in each wide bottom part is prone to be generated. The gate electrode including the void is a cause of providing a stress on the semiconductor substrate in a subsequent thermal treatment step, and a crystal defect is generated, and a leakage is prone to be generated.

Solution to Technical Problem

The semiconductor device disclosed in the description of the present application comprises a semiconductor substrate; and a plurality of trench gates extending in a first direction and arranged with a space between one another in a second direction which is orthogonal to the first direction. Each of the plurality of trench gates comprises: a first portion opened on a front surface of the semiconductor substrate; a second portion extending from the first portion in a direction inclined relative to a depth direction of the semiconductor substrate toward a positive direction of the second direction; and a third portion extending from the first portion in a direction inclined relative to the depth direction of the semiconductor substrate toward a negative direction of the second direction.

In the above-described semiconductor device, each of the plurality of trench gates comprises the first portion opened on the front surface of the semiconductor substrate; and the second portion and the third portion extending from the first portion in the direction inclined relative to the depth direction of the semiconductor substrate toward the positive direction and the negative direction of the second direction, respectively. The second portion in one trench gate and the third portion in another trench gate adjacent thereto extend in the respective directions in which the second portion and the third portion come close to each other along the depth direction of the semiconductor substrate. Thus, in the trench gates adjacent to each other, ensuring an enough space between the first portions and narrowing a space between the second portion and the third portion can be both satisfied. Each of the shapes of the second portion and the third portion can be same as the shape of the trench extending along the depth direction of the conventional semiconductor substrate. Therefore, the production step is simple, and a void in the gate electrode is less prone to be generated.

It is preferable that the inclination angle of the second portion relative to the depth direction of the semiconductor substrate is same as an inclination angle of the third portion relative to the depth direction of the semiconductor substrate.

It is preferable that the semiconductor substrate comprises: a first conductivity type drift layer; and a second conductivity type body layer disposed on a front surface side of the semiconductor substrate relative to the drift layer, and the body layer is located below a connecting position at which the first portion is connected with the second portion and the third portion.

The description of the present application discloses a production device for the semiconductor device, useful in production of the above-described semiconductor device. This production device comprises: a chamber; a stage arranged in the chamber and on which the semiconductor substrate is mounted; a generator configured to generate etching ions in the chamber; a magnetic field generator configured to provide a magnetic field for the etching ions in the chamber; and a drive mechanism configured to adjust a direction of the magnetic field by adjusting a position of the magnetic field generator relative to the stage.

DESCRIPTION OF EMBODIMENTS

The semiconductor device according to the present description is only required to include trench gates and is not particularly limited. Examples of the semiconductor device include IGBT, MOSFET, and a diode.

First Embodiment

Figure 1:
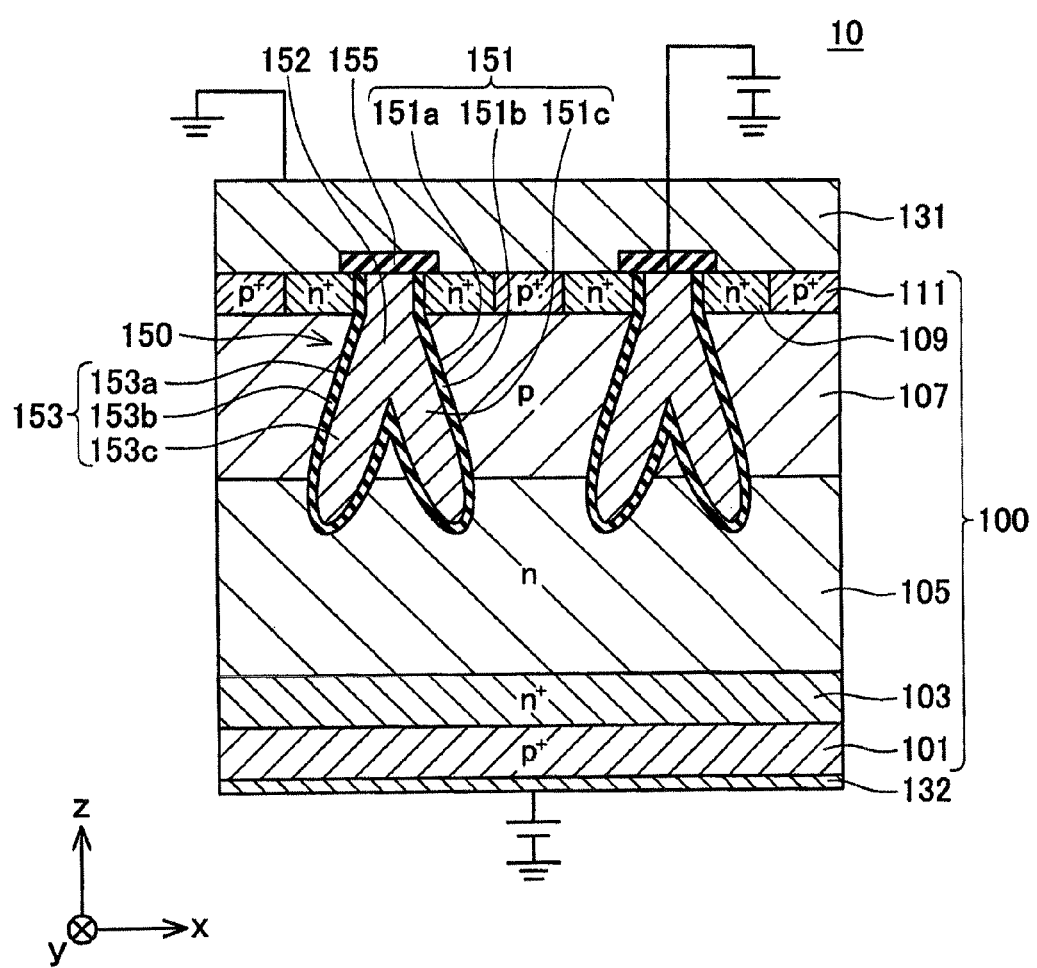
FIG. 1 is a cross-sectional view of a semiconductor device according to a first embodiment.

As shown in FIG. 1, a semiconductor device 10 includes a semiconductor substrate 100, trench gates 150, a surface electrode 131, and a back electrode 132. IGBT is formed in the semiconductor substrate 100.

The semiconductor substrate 100 includes a p-type collector layer 101, an n-type buffer layer 103 disposed on a front surface of the collector layer 101, an n-type drift layer 105 disposed on a front surface of the buffer layer 103, a p-type body layer 107 disposed on a front surface of the drift layer 105, and n-type emitter layers 109 and p-type body contact layers 111 disposed on a front surface of the body layer 107. The collector layer 101 is disposed on a back surface of the semiconductor substrate 100 and is in contact with the back electrode 132. The emitter layers 109 and the body contact layers 111 are disposed on a front surface of the semiconductor substrate 100 and are in contact with the surface electrode 131.

The plurality of trench gates 150 is formed in a region from the front surface of the semiconductor substrate 100 to the position deeper than the interface between the body layer 107 and the drift layer 105. The longitudinal directions of the plurality of trench gates 150 extend in a first direction (y direction), and the plurality of trench gates 150 are arranged with a space between one another in a second direction (x direction).

Each of the plurality of trench gates 150 includes a first portion 152 opened on the front surface of the semiconductor substrate 100, a second portion 151 extending from the first portion 152 in a third direction having an angle relative to a depth direction (z direction) of the semiconductor substrate 100 toward a positive direction of the x axis, and a third portion 153 extending in a fourth direction having an angle relative to the z direction toward a negative direction of the x axis. The first portion 152 extends substantially linearly from the front surface of the semiconductor substrate 100 to the inside of the body layer 107 along the z direction and is branched into the second portion 151 and the third portion 153 in the body layer 107. The second portion 151 and the third portion 153 linearly extend from the position where the branching occurs in the body layer 107 to the position at the same depth in the drift layer 105. The angle formed between the third direction and the z direction is same as the angle formed between the fourth direction and the z direction. The angle formed between the third direction or the fourth direction and the z direction can be adjusted appropriately according to the space between trench pitches (first portions 152), the thickness of the body layer 107, and the like in the semiconductor device 10 and is preferably more than 0° and 45° or less.

An insulating layer 155 is disposed on the front surface of the semiconductor substrate 100 so as to cover the first portion 152. The gate electrodes 151c and 153c and the surface electrode 131 are insulated by the insulating layer 155.

The second portion 151 includes a trench 151a, a gate insulating film 15 1b formed on the inner surface of the trench 151 a, and an a gate electrode 151 c filled in the trench 151 a so as to be in contact with the gate insulating film 15 1b. The third portion 153 includes a trench 153a, a gate insulating film 153b formed on the inner surface of the trench 153a, and a gate electrode 153c filled in the trench 153a so as to be in contact with the gate insulating film 153b. The trenches 151a and 153a, the gate insulating films 151b and 153b, and the gate electrodes 151c and 153c extend to the first portion 152 and reach the front surface of the semiconductor substrate 100.

The third direction and the fourth direction are symmetric with each other with respect to a yz plane, and the second portion 151 and the third portion 153 have substantially the same shape and size. That is, the second portion 151 and the third portion 153 have a relationship of being substantially symmetric with each other with respect to the yz plane which passes through the central position of the x direction of each trench gate 150.

The trenches 151a and 153a are connected with each other at a central position in the x axis direction of the trench gates 150. The connecting position at which the trenches 151 a and 153a are connected with each other is in the body layer 107, and the body layer 107 and the drift layer 105 are located between the trenches 151a and 153a. The gate insulating films 151b and 153b are formed of one insulating film. The gate electrodes 151c and 153c are formed of one polysilicon layer and integrated on the front surface side of the semiconductor substrate 100.

For example, as shown in FIG. 1, when the surface electrode 131 is earth-connected, the back electrode 132 has a positive electric potential, and each of the gate electrodes 151 c and 153c has a positive electric potential, a current flows from the back electrode 132 side toward the surface electrode 131 side in the semiconductor device 10.

Figure 2:
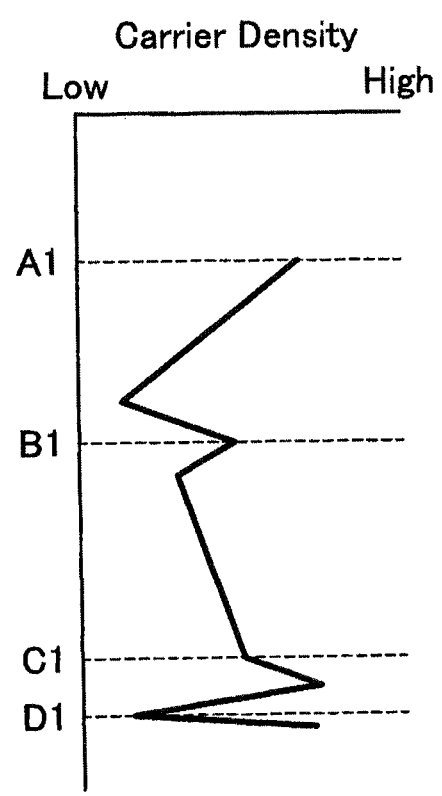
FIG. 2 is a drawing conceptually showing a carrier density distribution in the semiconductor device of FIG. 1.

FIG. 2 shows a carrier density distribution in the semiconductor device 10. The vertical axis indicates a position of the semiconductor substrate 100 in the depth direction. A1 indicates the position of the upper end of the body layer 107, B1 indicates the position of the interface between the body layer 107 and the drift layer 105, C1 indicates the position of the interface between the drift layer 105 and the buffer layer 103, and D1 indicates a position of the interface between the buffer layer 103 and the collector layer 101.

Figure 11:
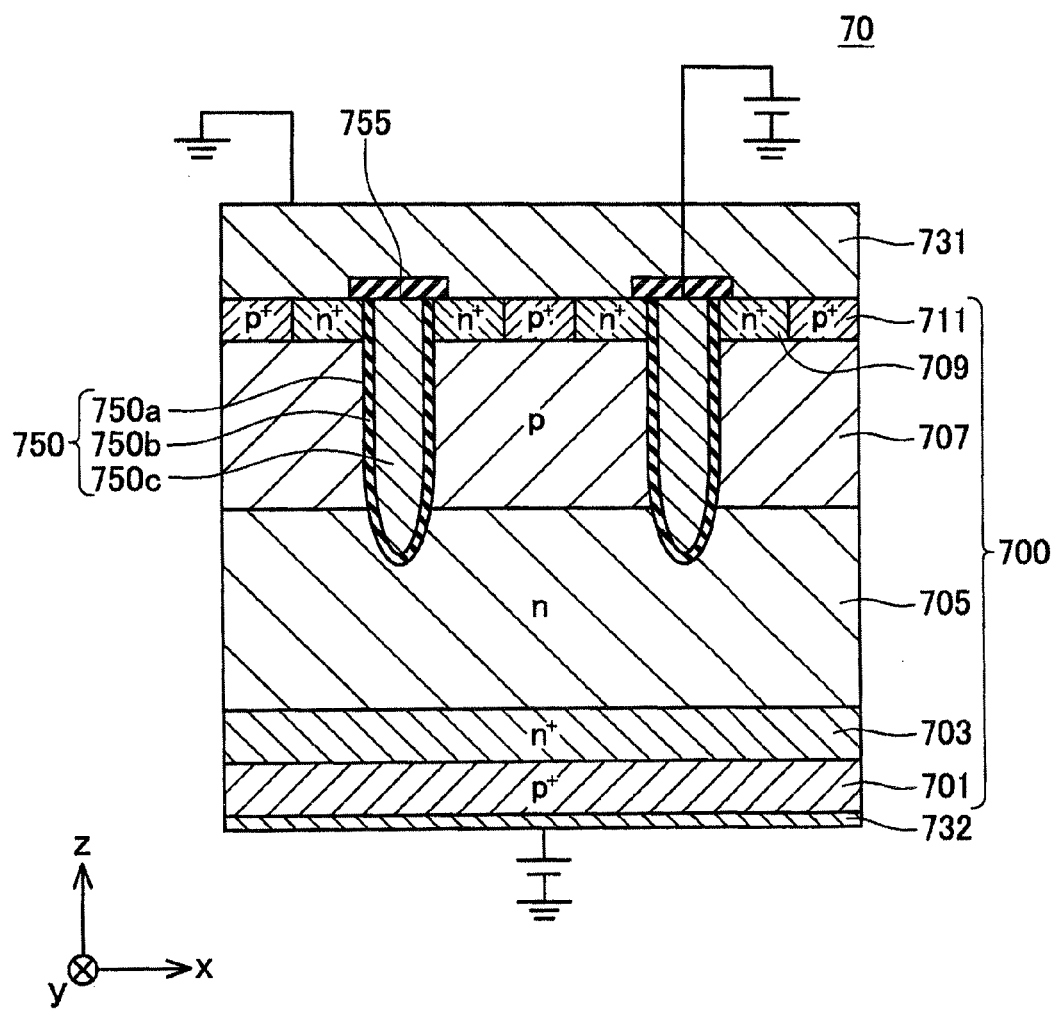
FIG. 11 is a cross-sectional view of a conventional semiconductor device.
Figure 12:
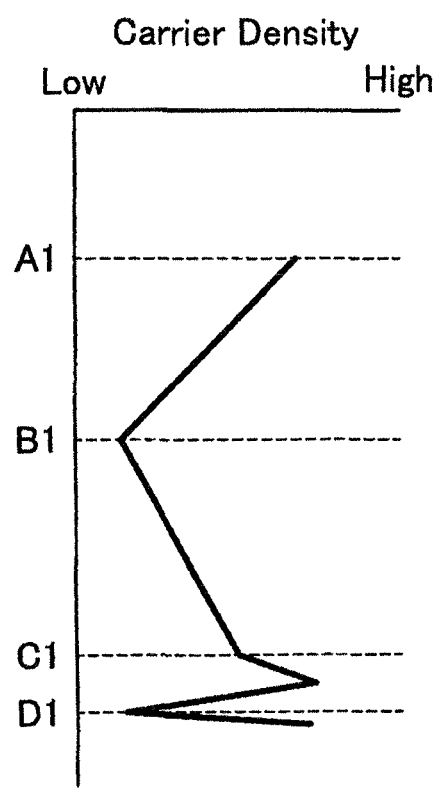
FIG. 12 is a drawing conceptually showing a carrier density distribution in the semiconductor device of FIG. 11.

For comparison, a carrier density distribution in a conventional semiconductor device 70 shown in FIG. 11 is shown in FIG. 12. As shown in FIG. 11, the semiconductor device 70 includes trench gates 750 extending in the depth direction of the semiconductor substrate 700. Each of the trench gates 750 includes a trench 750a, a gate insulating film 750b formed on the inner surface of the trench 750a, and a gate electrode 750c filled in the trench 750a so as to be in contact with the gate insulating film 750b. The other configuration is same as the semiconductor device 10 shown in FIGS. 1, and 100s reference numbers in the semiconductor device 10 are replaced with 700s reference numbers, and the description thereof is omitted.

As shown in FIG. 12, in the conventional semiconductor device 70, the carrier density is uniformly reduced from the front surface of the semiconductor substrate 700 to the interface between a body layer 707 and a drift layer 705. Thus, the carrier density in the drift layer 705 in the vicinity of the body layer 707 is low.

In contrast, in the semiconductor device 10 according to the first embodiment, each of the trench gates 150 includes the second portion 151 and the third portion 153 extending in the respective directions which are opposite to each other relative to the x direction. Thus, the distance between the adjacent trench gates 150 is gradually reduced from the front surface of the semiconductor substrate 100 toward the vicinity of the front surface of the drift layer 105 at which the bottom parts of the trench gates 150 are positioned. Thus, as shown in FIG. 2, the carrier density in the semiconductor device 10 is gradually reduced from the front surface of the semiconductor substrate 100 toward the depth direction, and the reduction in carrier density is stopped at the position shallower than the interface between the body layer 107 and the drift layer 105. Then, the carrier density is gradually increased to the position reaching the drift layer 105. Thus, in the semiconductor device 10 the carrier density in the drift layer 105 in the vicinity of the body layer 107 is high, and an on resistance is reduced.

Figure 3:
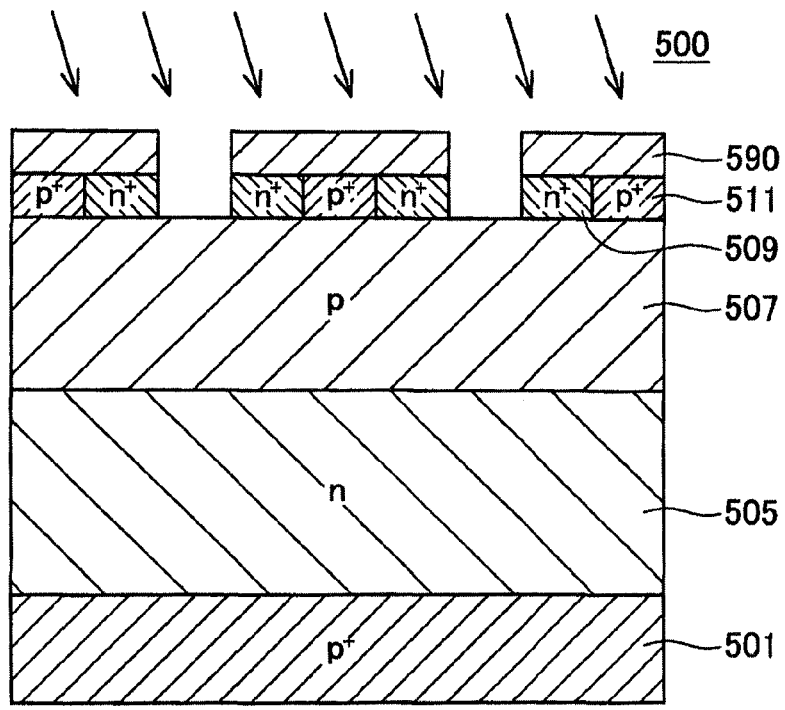
FIG. 3 is an illustration describing a production method for the semiconductor device of the first embodiment.

The production method and production device for the semiconductor device 10 are described with reference to FIGS. 3 to 10. First, as shown in FIG. 3, a semiconductor substrate 500 is provided. On the semiconductor substrate 500, in order from the back surface side, a p layer 501 as a collector layer 101, an n layer 505 as a drift layer 105, and a p layer 507 as a body layer 107 are laminated, and on the front surface of the p layer 507, n layers 509 as emitter layers 109 and p layers 511 as body contact layers 111 are formed. On the front surface of the semiconductor substrate 500, a mask 590 of an oxide film in which regions of forming trench gates 150 are opened is formed. In this state, as shown in FIG. 3, irradiation with etching ions is performed along the third direction in which the second portion 151 of each trench gate 150 extends. Thus, as shown in FIG. 4, trenches 551a extending in the third direction can be formed in the semiconductor substrate 500.

Figure 4:
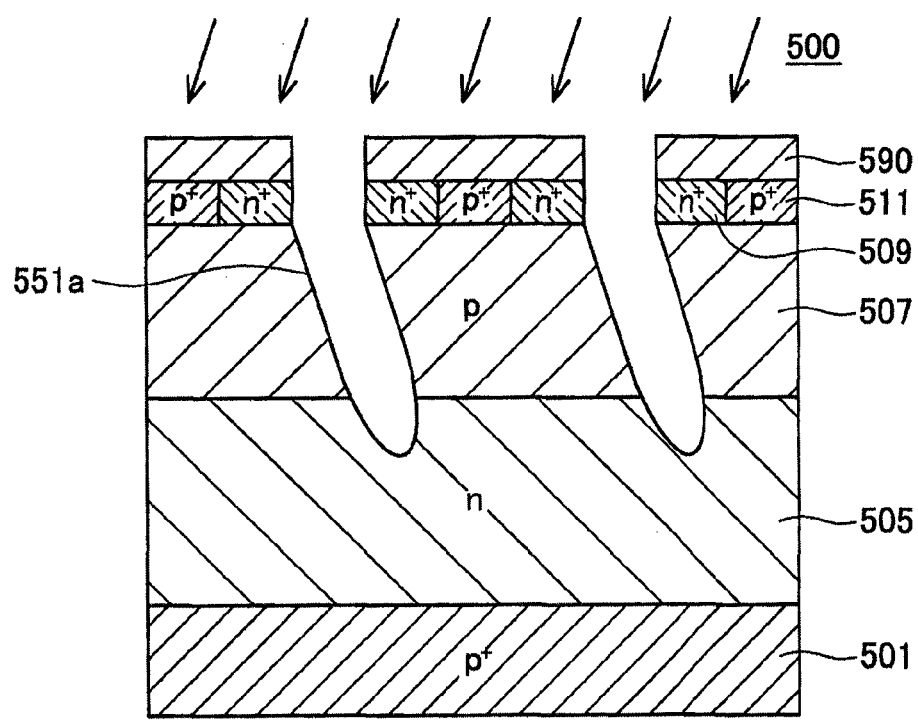
FIG. 4 is another illustration describing the production method for the semiconductor device of the first embodiment.
Figure 5:
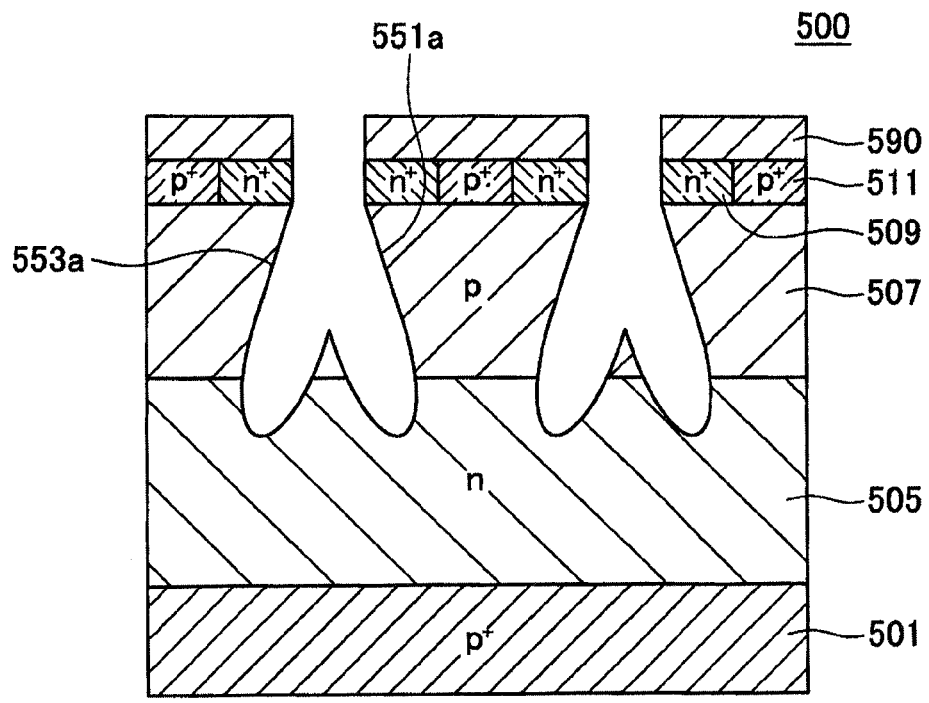
FIG. 5 is yet another illustration describing the production method for the semiconductor device of the first embodiment.

Subsequently, as shown in FIG. 4, the semiconductor substrate 500 is irradiated with etching ions along the fourth direction. By the irradiation, as shown in FIG. 5, trenches 553a extending in the fourth direction can be formed in the semiconductor substrate 500. A trench which has one opening and extends in two directions by branching the bottom part can be formed in the semiconductor substrate 500.

Figure 9:
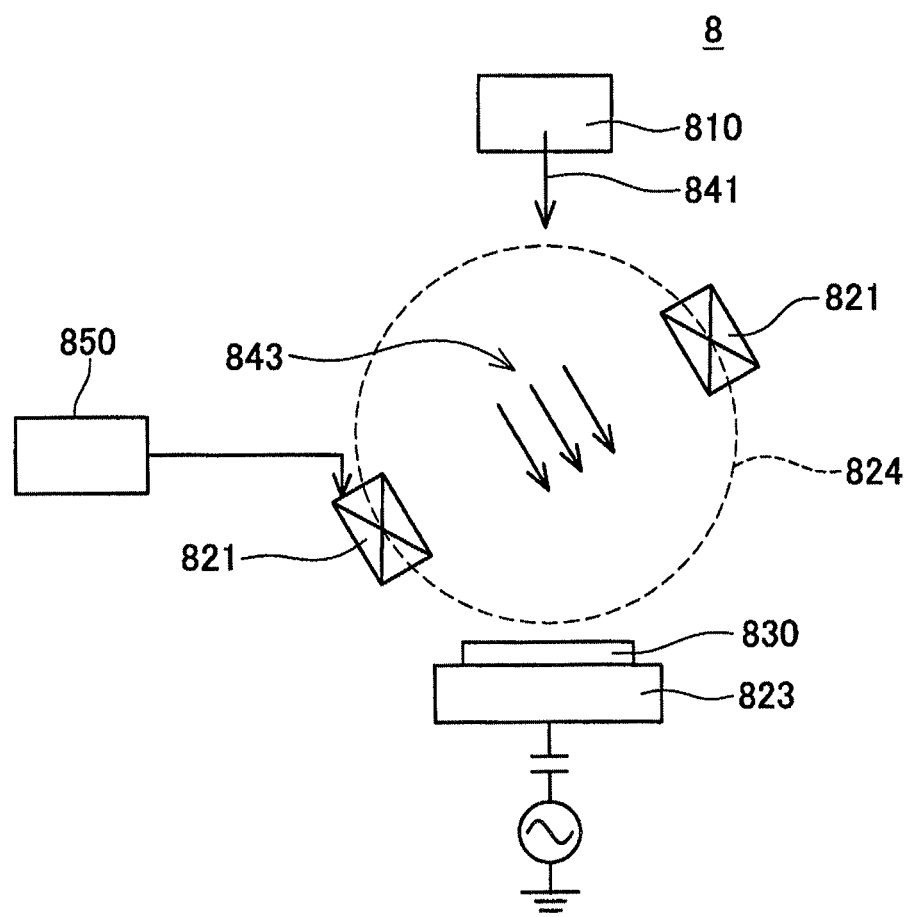
FIG. 9 is a drawing conceptually showing a production device for the semiconductor device of the first embodiment.
Figure 10:
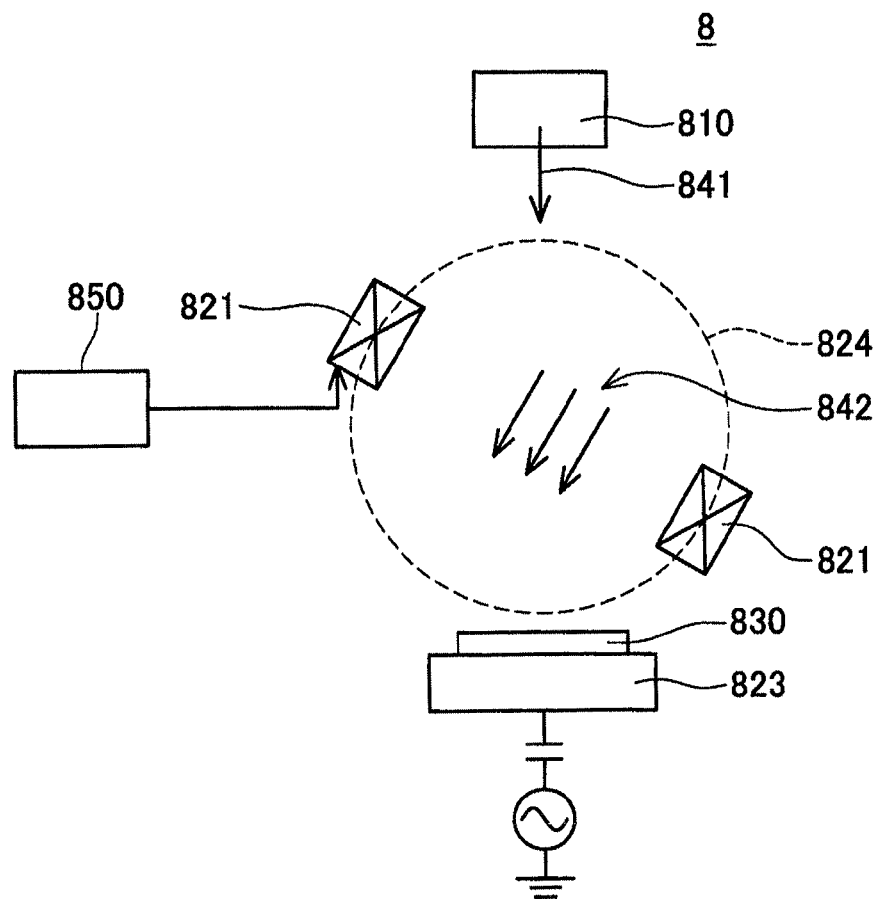
FIG. 10 is another drawing conceptually showing the production device for the semiconductor device of the first embodiment.

An example of the method and device for irradiation of the semiconductor substrate 500 with etching ions in the third direction or the fourth direction is described with reference to FIGS. 9 and 10. As shown in FIG. 9, a device 8 for use in etching includes a chamber (not shown), a generator 810 configured to generate etching ions in the chamber, a magnetic field generator 821 configured to accelerate etching ions by providing a magnetic field, a stage 823, and a drive mechanism 850 configured to adjust the position of the magnetic field generator 821 relative to the stage 823. The stage 823 is connected to an RF power supply. A semiconductor substrate 830 configured to perform an etching process can be mounted on the stage 823.

The magnetic field generator 821 is one cylindrical coil, and FIG. 9 shows a cross section along the longitudinal direction of the cylindrical shape. The drive mechanism 850 can rotate and move the magnetic field generator 821 around the center of the orbit 824 in the chamber. The orbit 824 indicates an orbit in which a coil part of the magnetic field generator 821 can move. The drive mechanism 850 can be operated from outside of the chamber and can rotate and move the magnetic field generator 821 without changing the atmosphere in the chamber, such as by opening the chamber. The magnetic field generator 821 can generate a magnetic field in a direction along the central axis of the cylindrical magnetic field generator 821. As shown in FIG. 9, an angle of the magnetic field generator 821 relative to the stage 823 is adjusted so that the direction of the central axis of the magnetic field generator 821 becomes the third direction in which the second portion 151 of each trench gate 150 extends. Thus, a magnetic field in the third direction can be generated in the chamber. The etching ions 841 generated in the generator 810 become etching ions 843 in the third direction by the magnetic field in the third direction provided by the magnetic field generator 821, and the semiconductor substrate 830 is irradiated with the etching ions 843. Accordingly, as shown in FIG. 3, the semiconductor substrate 500 can be irradiated with the etching ions in the third direction.

After the irradiation with etching ions in the third direction, the magnetic field generator 821 is rotated and moved along the orbit 824. The magnetic field generator 821 can be rotated along the orbit 824 in the chamber without opening the chamber. As shown in FIG. 10, the drive mechanism 850 adjusts an angle of the magnetic field generator 821 relative to the stage 823 so that the direction of the central axis of the magnetic field generator 821 becomes the fourth direction in which the third portion 153 of each trench gate 150 extends. Thus, the magnetic field generator 821 can generate a magnetic field in the fourth direction in the chamber. The etching ions 841 generated by the generator 810 become etching ions 842 in the fourth direction by a magnetic field in the fourth direction provided by the magnetic field generator 821, and the semiconductor substrate 830 is irradiated with the etching ions 842. Accordingly, as shown in FIG. 4, the semiconductor substrate 500 can be irradiated with the etching ions in the fourth direction.

Figure 6:
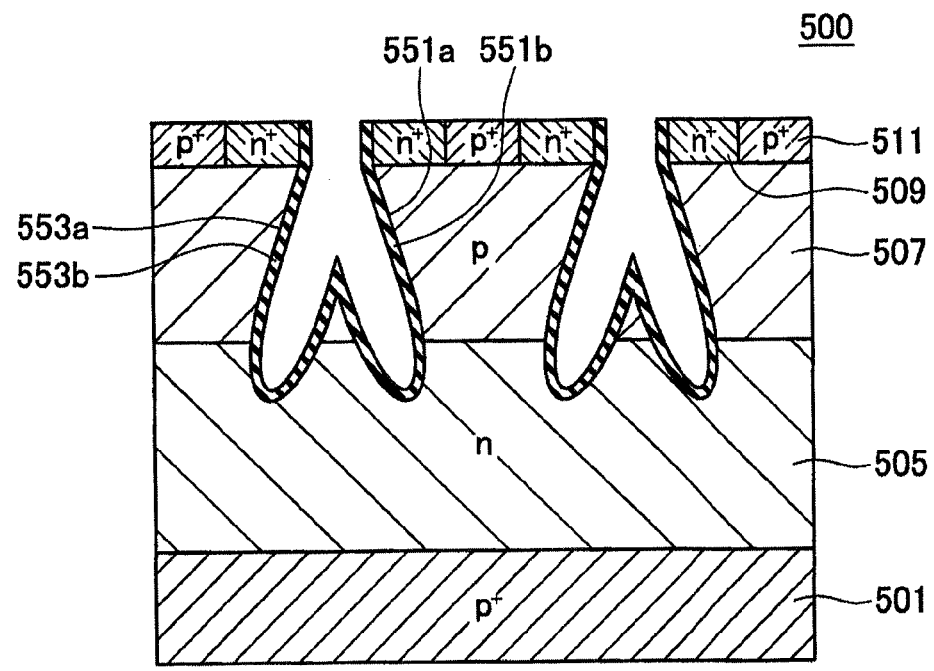
FIG. 6 is yet another illustration describing the production method for the semiconductor device of the first embodiment.

The semiconductor substrate 500 of FIG. 5 is subjected to a surface oxidation process, and as shown in FIG. 6, gate insulating films 551b and 553b are formed in the trenches 551a and 553a, respectively. The gate insulating films 551b and 553b are integrally formed as one insulating film.

Figure 7:
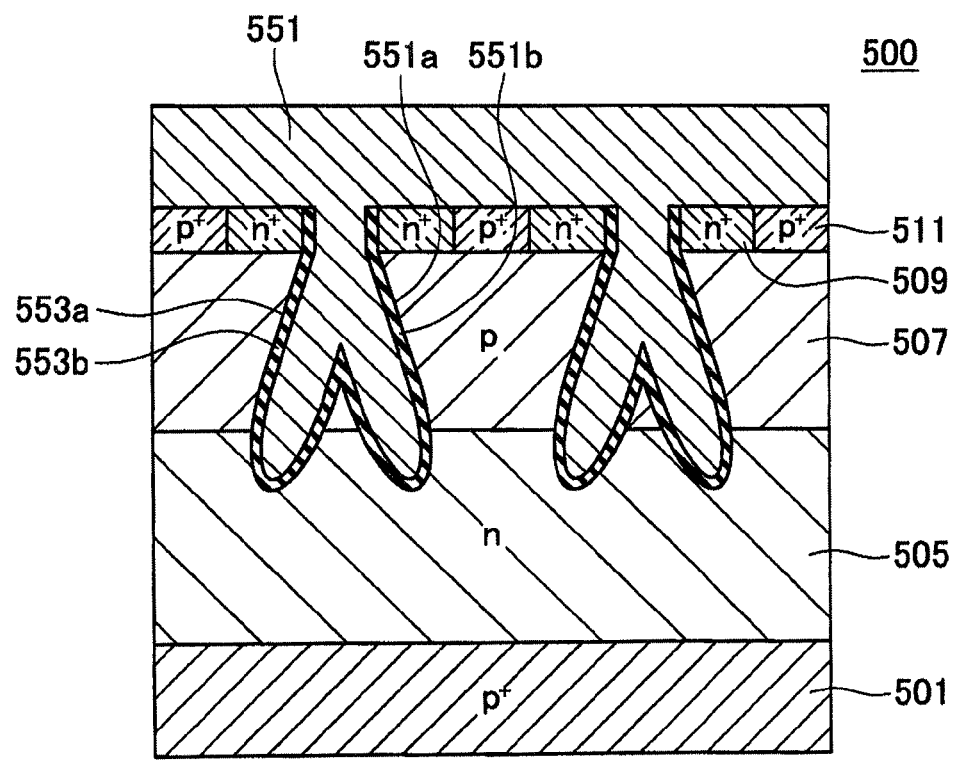
FIG. 7 is yet another illustration describing the production method for the semiconductor device of the first embodiment.

Subsequently, as shown in FIG. 7, a polysilicon layer 551 as gate electrodes 151c and 153c is formed. The polysilicon layer 551 is filled in the trenches 551a and 553a in the state of being covered with the insulating films 55 1b and 553b, and a part of the polysilicon layer 551 is deposited on the front surface of the semiconductor substrate 500. The trenches 551a and 553a linearly extend from the opening in the front surface of the semiconductor substrate 500 along the third direction and the fourth direction, respectively. Thus, the polysilicon layer 551 is easily filled in the trenches 551a and 553a without including a void.

Figure 8:
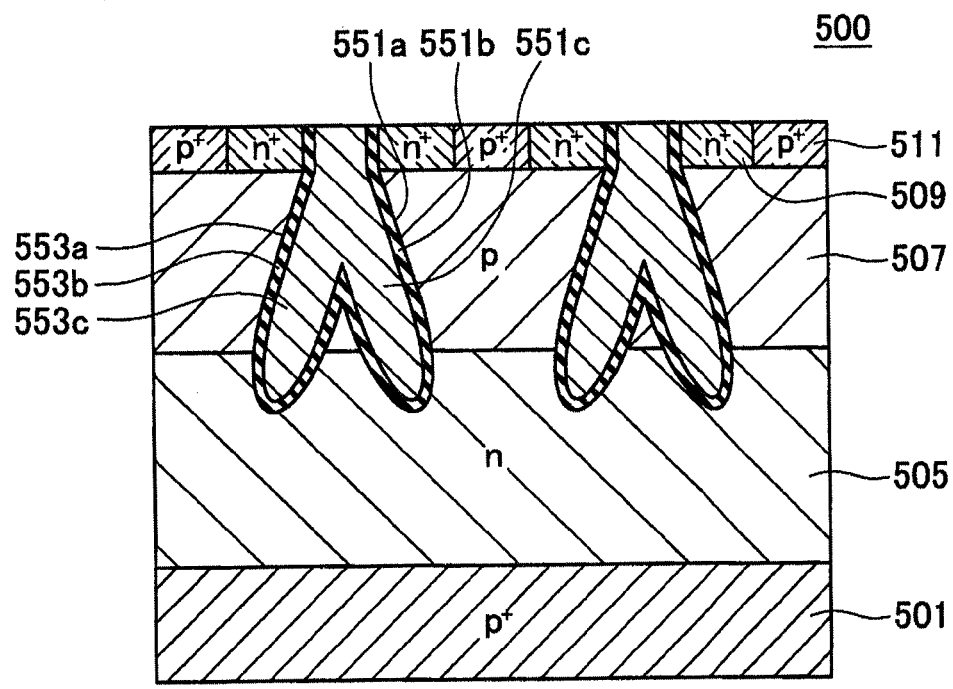
FIG. 8 is yet another illustration describing the production method for the semiconductor device of the first embodiment.

Then, as shown in FIG. 8, the polysilicon layer 551 on the front surface of the semiconductor substrate 500 is removed by etching or the like. Furthermore, the surface insulating film 155, the surface electrode 131, the back electrode 132, and the like shown in FIG. 1 are formed. Thus, the semiconductor device 10 can be formed.

As described above, according to the semiconductor device 10, each of the plurality of trench gates 150 includes a first portion 152 opened on the front surface of the semiconductor substrate and a second portion 151 and a third portion 153 extending from the first portion 152 in the third direction and the fourth direction, respectively. The third direction and the fourth direction are the respective directions having angles relative to the depth direction (z direction) of the semiconductor substrate 100 toward the positive direction (positive direction of the x axis) and the negative direction (negative direction of the z axis) of the second direction. A second portion 151 in one trench gate 150 and a third portion 153 in another trench gate 150 adjacent thereto extend in the respective directions in which the second portion 151 and the third portion 153 come close to each other along the depth direction of the semiconductor substrate 100. Thus, in the trench gates 150 adjacent to each other, ensuring a enough space between the first portions 152 and narrowing a space between the second portion and the third portion can be both satisfied. The first portion 152 substantially linearly extends from the front surface of the semiconductor substrate 100 to the inside of the body layer 107 along the z direction. The shape of the first portion 152, however, is not limited thereto. For example, the first portion 152 may have a shape inclining toward the positive direction side of the x axis as in the second portion 151, inclining toward the negative direction side of the x axis as in the third portion 153, and gradually reducing the trench width (width in the x direction) from the negative direction side of the z axis toward the positive direction side of the z axis.

Moreover, the second portion 151 and the third portion 153 have substantially the same shape and size and extend in the respective directions which are opposite to each other and have the same inclination angle, relative to the yz plane which passes through the central position of the x direction of the trench gate 150. The second portion 151 and the third portion 153 branched from the first portion 152 form a pair and are symmetric with each other with respect to the yz plane. Thus, at the time when the semiconductor device 10 is on, the length of the current path on the second portion 151 side and the length of the current path on the third portion 153 side are substantially same, and the current paths have no variation. For example, in the case where the trench gate 150 is branched into three portions, and a central portion extending along the negative direction of the z axis is further provided between the second portion 151 and the third portion 153, the length of the current paths in the central portion is different from the lengths of the current paths in the second portion 151 and the third portion 153. When the current paths have variations, a large current flows in a path through which the current more easily flows, which provides a cause of element breakdown in some cases. In the semiconductor device 10, current paths have no variation. Thus, the element breakdown is less prone to occur.

Furthermore, in the semiconductor device 10, the body layer 107 is located below a connecting position at which the first portion 152 is connected with the second portion 151 and the third portion 153. Therefore, at the time when the semiconductor device 10 is off, carriers below the connecting position with the second portion 151 and the third portion 153 are discharged promptly. Accordingly, when the semiconductor device 10 is subsequently turned on, an on voltage is stabilized.

Each of the shapes of the second portion 151 and the third portion 153 can be a shape extending linearly along one direction as in the trench gate 750 extending in the depth direction of the semiconductor substrate 700 such as in the conventional semiconductor device 70. Thus, the production step is simple, and the gate electrodes 151c and 153c can be filled in the trench 151a and 153a, respectively, without including a void.

Moreover, when the device 8 is used in the production step of the semiconductor device 10, the direction of the magnetic field generated by the movable magnetic field generator 821 can be easily adjusted, an angle at which irradiation with etching ions is performed can be easily adjusted. Thus, in the production step of the semiconductor device 10, the trenches 551a and 553a extending in the third direction and the fourth direction, respectively, can be easily formed in the semiconductor substrate 500.

Specific examples of the present invention have been described in detail, however, these are mere exemplary indications and thus do not limit the scope of the claims. The art described in the claims include modifications and variations of the specific examples presented above.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
a semiconductor substrate; and
a plurality of trench gates extending in a first direction and arranged with a space between one another in a second direction which is orthogonal to the first direction, wherein
each of the plurality of trench gates comprises:
an opening portion, and
a bottom portion branched into first and second branches and extending in two directions such that there is a gap separating the first and second branches along the second direction,
the opening portion is a first portion opened on a front surface of the semiconductor substrate, and
the bottom portion is configured by
a second portion as the first branch extending from the first portion in a direction inclined relative to a depth direction of the semiconductor substrate toward a positive direction of the second direction, and
a third portion as the second branch extending from the first portion in a direction inclined relative to the depth direction of the semiconductor substrate toward a negative direction of the second direction,
the bottom portion being without a central portion extending along the depth direction in the gap between the second portion and the third portion so that no portion of the bottom portion is disposed between the second portion and the third portion along the second direction.

2. The semiconductor device according to claim 1, wherein an inclination angle of the second portion relative to the depth direction of the semiconductor substrate is same as an inclination angle of the third portion relative to the depth direction of the semiconductor substrate.

3. The semiconductor device according to claim 1, wherein the semiconductor substrate comprises:
a first conductivity type drift layer; and
a second conductivity type body layer disposed on a front surface side of the semiconductor substrate relative to the drift layer, wherein
the body layer is located below a connecting position at which the first portion is connected with the second portion and the third portion.

4. A production device for the semiconductor device according to claim 1, the production device comprising:
a chamber;
a stage fixedly arranged in the chamber and on which the semiconductor substrate is mounted;
a generator configured to generate etching ions in the chamber;
a magnetic field generator configured to provide a magnetic field for the etching ions in the chamber; and
a drive mechanism configured to adjust a direction of the magnetic field by adjusting a position of the magnetic field generator relative to the stage.

5. The semiconductor device according to claim 3, wherein the drift layer is disposed in the gap between the second portion and the third portion along the second direction, and no portion of the bottom portion is disposed in the drift layer between the second portion and the third portion along the second direction.

6. The semiconductor device according to claim 3, wherein the body layer is disposed in the gap between the second portion and the third portion along the second direction, and no portion of the bottom portion is disposed in the body layer between the second portion and the third portion along the second direction.

\* \* \* \* \*